United States Patent
Oikawa

(10) Patent No.: US 11,664,387 B2
(45) Date of Patent: May 30, 2023

(54) ELECTRO-OPTICAL DEVICE HAVING OPENINGS WITH INNER WALLS AND ELECTRONIC APPARATUS

(71) Applicant: SEIKO EPSON CORPORATION, Tokyo (JP)

(72) Inventor: Hiroyuki Oikawa, Chitose (JP)

(73) Assignee: SEIKO EPSON CORPORATION, Tokyo (JP)

( * ) Notice: Subject to any disclaimer, the term of this patent is extended or adjusted under 35 U.S.C. 154(b) by 73 days.

(21) Appl. No.: 17/161,743

(22) Filed: Jan. 29, 2021

(65) Prior Publication Data

US 2021/0242245 A1 Aug. 5, 2021

(30) Foreign Application Priority Data

Jan. 30, 2020 (JP) .............................. JP2020-013344

(51) Int. Cl.

| H01L 27/12 | (2006.01) |
|---|---|
| G02F 1/1362 | (2006.01) |
| H01L 29/78 | (2006.01) |
| G02F 1/16756 | (2019.01) |
| G02F 1/1333 | (2006.01) |

(52) U.S. Cl.
CPC ...... *H01L 27/124* (2013.01); *G02F 1/133345* (2013.01); *G02F 1/136209* (2013.01); *G02F 1/136213* (2013.01); *G02F 1/136227* (2013.01); *G02F 1/136286* (2013.01); *G02F 1/16756* (2019.01); *H01L 27/1237* (2013.01); *H01L 27/1255* (2013.01); *H01L 29/7833* (2013.01); *G02F 2202/10* (2013.01)

(58) Field of Classification Search
CPC combination set(s) only.
See application file for complete search history.

(56) References Cited

U.S. PATENT DOCUMENTS

| 2008/0143664 A1 | 6/2008 | Nakagawa |
| 2018/0173064 A1* | 6/2018 | Ohori .................... G02F 1/1368 |

FOREIGN PATENT DOCUMENTS

| JP | 2001-177100 A | | 6/2001 | |
| JP | 2008-151900 A | | 7/2008 | |
| JP | 2008-216621 A | | 9/2008 | |
| JP | 2009-047967 A | | 3/2009 | |
| JP | 2009-48064 | * | 3/2009 | ........... G02F 1/1368 |

(Continued)

*Primary Examiner* — Lauren Nguyen
(74) *Attorney, Agent, or Firm* — Oliff PLC

(57) ABSTRACT

In an electro-optical device, a first opening and a second opening are provided in an interlayer insulating layer provided in a layer between a transistor and a scanning line, with a semiconductor layer interposed between the first opening and the second opening in plan view. A portion of a gate electrode is provided inside the first opening, and the gate electrode is electrically connected to the scanning line via the first opening. The second opening does not overlap with the gate electrode, and a portion of a first capacitance electrode of a capacitance element is provided in the second opening, the first capacitance electrode having light shielding properties. Therefore, the width of the scanning line can be made narrower than in a case in which the gate electrode and the scanning line are electrically connected to each other via both the first opening and the second opening.

15 Claims, 15 Drawing Sheets

(56) References Cited

FOREIGN PATENT DOCUMENTS

| JP | 2009-069246 A | 4/2009 | | |
|----|---------------|--------|---|---|
| JP | 2009-139417 A | 6/2009 | | |
| JP | 2010-096966 A | 4/2010 | | |
| JP | 2012-103385 A | 5/2012 | | |
| JP | 2013-182144 A | 9/2013 | | |
| JP | 2013-183051 A | 9/2013 | | |
| JP | 2018-101067 A | 6/2018 | | |
| JP | 2018-146870 | * | 9/2018 | ........... G02F 1/1368 |
| WO | 2017/086116 A1 | 5/2017 | | |
| WO | 2018/074060 A1 | 4/2018 | | |

* cited by examiner

ELECTRO-OPTICAL DEVICE HAVING OPENINGS WITH INNER WALLS AND ELECTRONIC APPARATUS

The present application is based on, and claims priority from JP Application Serial Number 2020-013344, filed Jan. 30, 2020, the disclosure of which is hereby incorporated by reference herein in its entirety.

BACKGROUND

1. Technical Field

The present disclosure relates to an electro-optical device including a transistor in which a gate electrode is provided on the opposite side from a scanning line with respect to a semiconductor layer, and an electronic apparatus.

2. Related Art

An electro-optical device (a liquid crystal device) used as a light valve or the like of a projection-type display apparatus is provided with a semiconductor layer between a substrate main body and a pixel electrode, and a transistor is configured using the semiconductor layer. In such an electro-optical device, when light from a light source is incident on an LDD region, which is interposed between a pixel electrode-side source drain region electrically coupled to a pixel electrode side of the semiconductor layer, and a channel region, this causes an optical leakage current to be generated in the transistor. Thus, a structure is conceivable in which a semiconductor layer extending along a scanning line is provided so as to overlap with the scanning line, a gate electrode is provided on the opposite side from the scanning line with respect to the semiconductor layer, and the gate electrode and the scanning line are electrically coupled via an opening provided in both sides of the semiconductor layer (see FIG. 2B and the like of WO 2017/086116). According to such a structure, a light shielding wall can be configured that inhibits light from entering the LDD region. using the gate electrode provided inside the opening.

However, in the configuration in which the gate electrode and the scanning line are electrically coupled via the opening provided in both sides of the semiconductor layer, it is necessary to form the scanning line such that the width of the scanning line overlaps with the opening provided in both sides of the semiconductor layer. Further, since there is a risk that the gate electrode and the semiconductor layer may affect each other electrically, the semiconductor layer and the opening need to be separated from each other to a certain extent in plan view, so the width of the scanning line needs to be widened. Therefore, when light shielding is performed by the light shielding wall formed inside the opening provided in both sides of the semiconductor layer, the width of the scanning line needs to be widened, which results in a problem in that a reduction in a pixel aperture ratio cannot be avoided.

SUMMARY

In order to solve the problem described above, an electro-optical device includes a scanning line, a transistor including a semiconductor layer, a gate electrode having light shielding properties and disposed on a side of the semiconductor layer opposite from a side of the scanning line, an interlayer insulating layer provided in a layer between the transistor and the scanning line and including a first opening and a second opening provided with the semiconductor layer interposed therebetween in plan view, and a capacitance element in which at least one of a first capacitance electrode and a second capacitance electrode has light shielding properties. A portion of the gate electrode is provided along an inner wall of the first opening, and a portion of the at least one of the first capacitance electrode and the second capacitance electrode is provided along an inner wall of the second opening.

The electro-optical device according to the present disclosure is used for various electronic apparatuses. According to an aspect of the present disclosure, when the electronic apparatus is a projection-type display apparatus, the projection-type display apparatus is provided with a light source unit that emits a light to be supplied to the electro-optical device, and a projection optical system that projects the light modulated by the electro-optical device.

DESCRIPTION OF EXEMPLARY EMBODIMENTS

Figure 1:
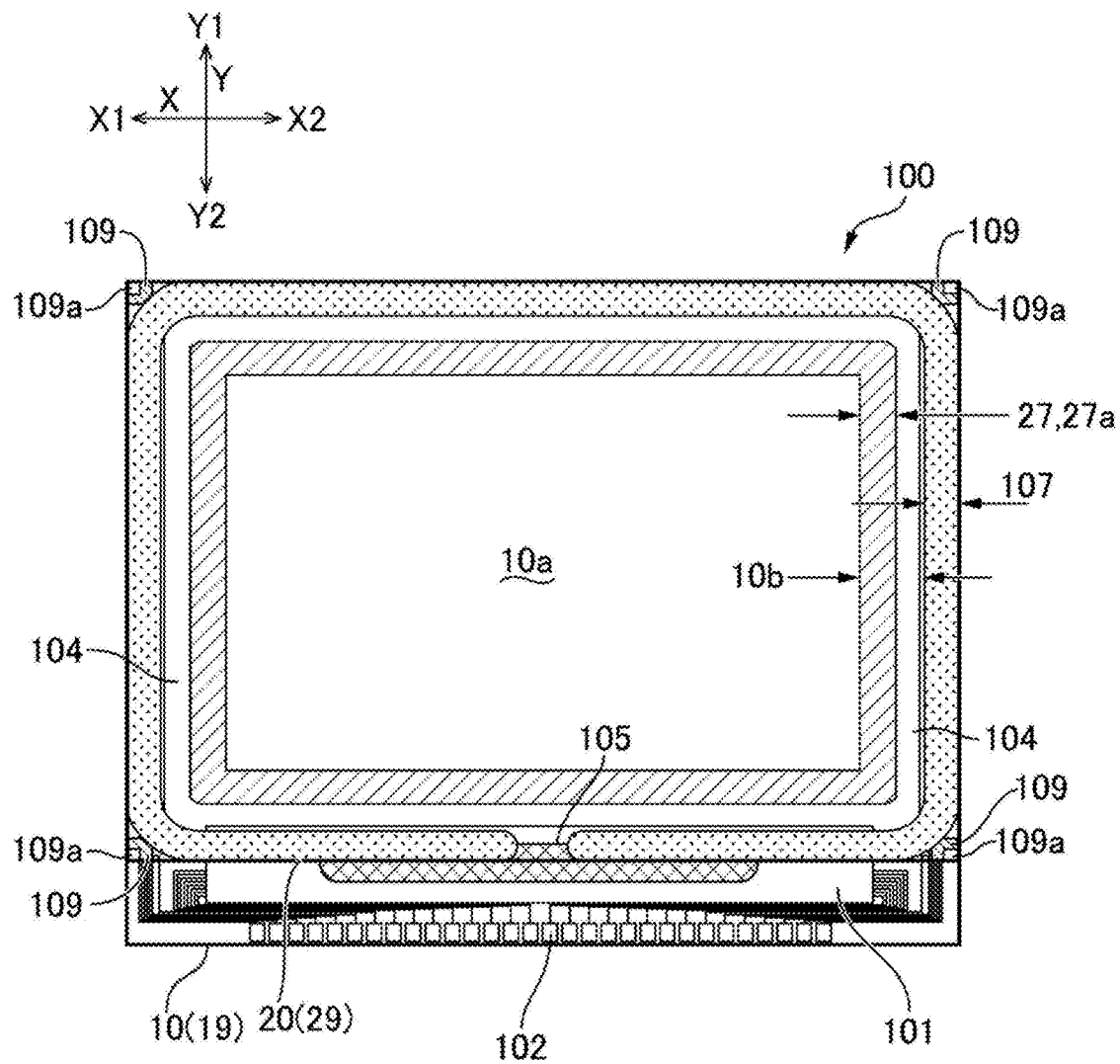
FIG. 1 is a plan view of an electro-optical device according to a first exemplary embodiment of the present disclosure.

Exemplary embodiments of the disclosure will be described below with reference to the drawings. Note that, in each of the figures to be referred to in the following description, to illustrate each layer, each member, and the like in a recognizable size in the drawings, each layer, each member, and the like are illustrated at a different scale. Further, in the following description, when each of layers formed in a first substrate 10 is described, an upper layer side or a front surface side means an opposite side (a side on which a second substrate 20 is located) to a side on which a substrate main body 19 is located, and a bottom layer side means the side on which the substrate main body 19 is located. Further, of two directions intersecting each other in an in-plane direction of the first substrate 10, a direction in which a data line 6a extends is referred to as a first direction Y, and a direction in which a scanning line 3a extends is referred to as a second direction X. Further, one side in the direction along the first direction Y is a first side Y1 in the first direction Y, the other side in the direction along the first direction Y is a second side Y2 in the first direction Y, one side in the direction along the second direction X is a first side X1 in the second direction X, and the other side in the direction along the second direction X is a second side X2 in the second direction X.

First Exemplary Embodiment

1. Configuration of Electro-Optical Device 100

Figure 2:
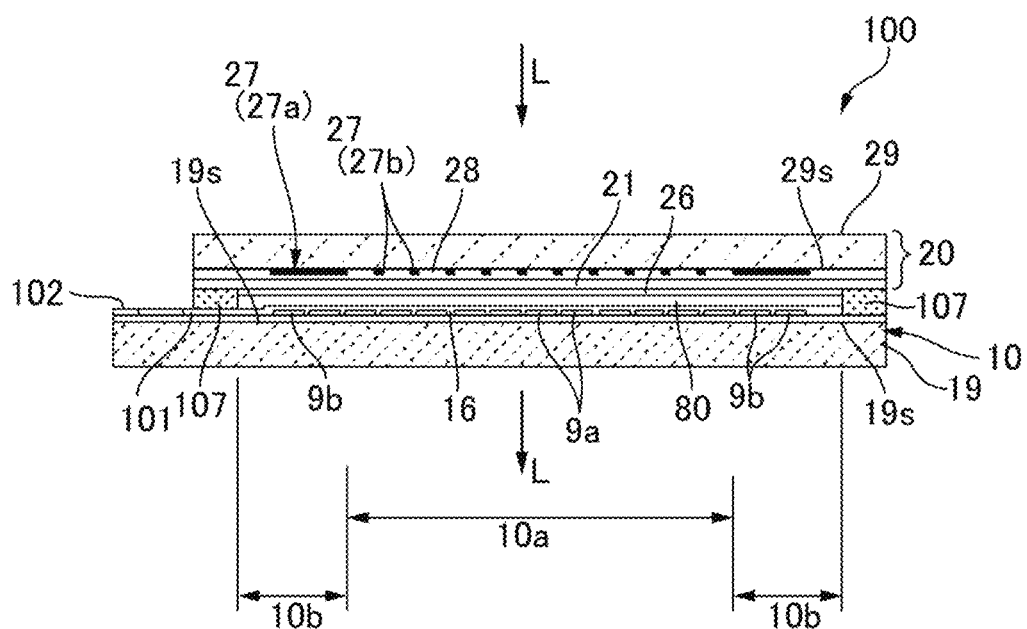
FIG. 2 is a cross-sectional view of the electro-optical device illustrated in FIG. 1.

FIG. 1 is a plan view of an electro-optical device 100 according to a first exemplary embodiment of the present disclosure. FIG. 2 is a cross-sectional view illustrating the electro-optical device 100 illustrated in FIG. 1. As illustrated in FIG. 1 and FIG. 2, in the electro-optical device 100, a first substrate 10 and a second substrate 20 are bonded together by a seal material 107 with a predetermined gap therebetween, and the first substrate 10 and the second substrate 20 face each other. The seal material 107 is provided in a frame shape so as to follow an outer edge of the second substrate 20, and an electro-optical layer 80 such as a liquid crystal layer is provided in a region surrounded by the seal material 107, between the first substrate 10 and the second substrate 20. The seal material 107 is a photocurable adhesive, or a photocurable and thermosetting adhesive, and a gap material, such as glass fiber or glass beads, for setting a distance between the substrates to a predetermined value, is mixed in the seal material 107. In the present exemplary embodiment, both the first substrate 10 and the second substrate 20 have a quadrangular shape, and in a substantially central portion of the electro-optical panel 100, a display region 10a is provided as a quadrangular region. In accordance with such a shape, the seal material 107 is also provided in a substantially quadrangular shape, and a peripheral region 10b having a rectangular frame shape is provided between an inner peripheral edge of the seal material 107 and an outer peripheral edge of the display region 10a.

The first substrate 10 includes a substrate main body 19 formed by a light-transmitting substrate, such as a quartz substrate, a glass substrate, or the like. On a first surface 19s side, which is the second substrate 20 side of the substrate main body 19, outside the display region 10a, a data line driving circuit 101 and a plurality of terminals 102 are formed along one side of the first substrate 10, and scanning line driving circuits 104 are formed along other sides adjacent to the one side. Although not illustrated, a flexible wiring substrate is coupled to the terminals 102, and various potentials and various signals are input to the first substrate 10 via the flexible wiring substrate.

On the first surface 19s side of the substrate main body 19, in the display region 10a, a plurality of pixel electrodes 9a, which are transmissive and formed of an indium tin oxide (ITO) film and the like, are formed in a matrix pattern. A first oriented film 16 is formed on the second substrate 20 side with respect to the pixel electrodes 9a, and the pixel electrodes 9a are covered with the first oriented film 16.

The second substrate 20 includes a substrate main body 29 formed by a transmissive substrate, such as a quartz substrate, a glass substrate, or the like. On the substrate main body 29, a transmissive common electrode 21, which is formed of the ITO film and the like, is formed on the side of a first surface 29s that faces the first substrate 10, and a second oriented film 26 is formed on the first substrate 10 side with respect to the common electrode 21. The common electrode 21 is formed over substantially the entire surface of the second substrate 20, and is covered with the second oriented film 26. On the second substrate 20, a light shielding layer 27, which has light shielding properties and is formed by a resin, a metal, or a metal compound, is formed between the substrate main body 29 and the common electrode 21, and a transmissive protective layer 28 is formed between the light shielding layer 27 and the common electrode 21. The light shielding layer 27 is formed, for example, as a partition 27a having a frame-like shape extending along the outer peripheral edge of the display region 10a. The light shielding layer 27 is also formed as a light shielding layer 27b that configures a black matrix in regions overlapping in plan view with regions respectively interposed between the pixel electrodes 9a adjacent to each other. Dummy pixel electrodes 9b, which are formed simultaneously with the pixel electrodes 9a, are formed in regions of the peripheral region 10b of the first substrate 10 that overlap with the partition 27a in plan view. Note that a lens may be provided on the second substrate 20 at a position facing the pixel electrodes 9a, and in this case, the light shielding layer 27b is not often formed.

The first oriented film 16 and the second oriented film 26 are each, for example, an inorganic oriented film formed by a diagonally vapor-deposited film of $SiO_x$ (x<2), $SiO_2$, $TiO_2$, MgO, $Al_2O_3$, or the like, and liquid crystal molecules having negative dielectric anisotropy used for the electro-optical layer 80 are diagonally oriented. Therefore, the liquid crystal molecules form a predetermined angle with respect to the first substrate 10 and the second substrate 20. In this way, the electro-optical device 100 is configured as a vertical alignment (VA) mode liquid crystal device.

On the first substrate 10, inter-substrate conduction electrodes 109 for establishing electrical conduction between the first substrate 10 and the second substrate 20 are formed in regions located outside the seal material 107 and overlapping with corner portions of the second substrate 20. An inter-substrate conduction material 109a including conductive particles is disposed in the inter-substrate conduction electrode 109, and the common electrode 21 of the second substrate 20 is electrically coupled to the first substrate 10 side via the inter-substrate conduction material 109a and the inter-substrate conduction electrode 109. Thus, a common potential is applied to the common electrode 21 from the first substrate 10 side.

In the electro-optical device 100, the pixel electrodes 9a and the common electrode 21 are formed of a transmissive conductive film such as the ITO film, and the electro-optical device 100 is configured as a transmissive liquid crystal device. In the electro-optical device 100, light that is incident on the electro-optical layer 80 from one of the first substrate 10 and the second substrate 20 is modulated while passing through the other substrate and being emitted, and displays an image. In the present exemplary embodiment, as indicated by an arrow L, light incident from the second substrate 20 is modulated by the electro-optical layer 80 for each pixel while passing through the first substrate 10 and being emitted, and displays an image.

2. Schematic Configuration of Pixels

Figure 3:
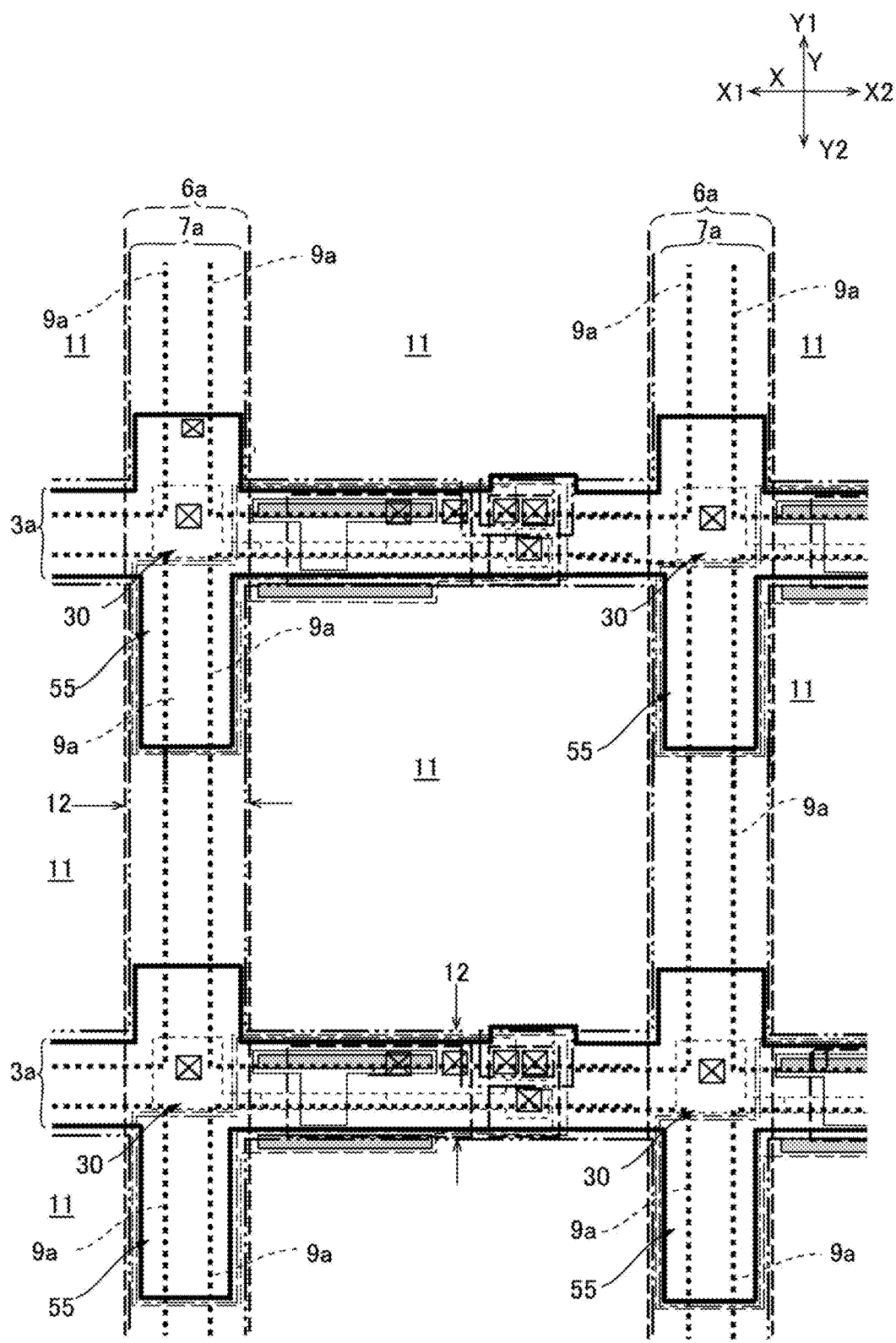
FIG. 3 is a plan view of a plurality of pixels adjacent to each other in the electro-optical device illustrated in FIG. 1.
Figure 4:
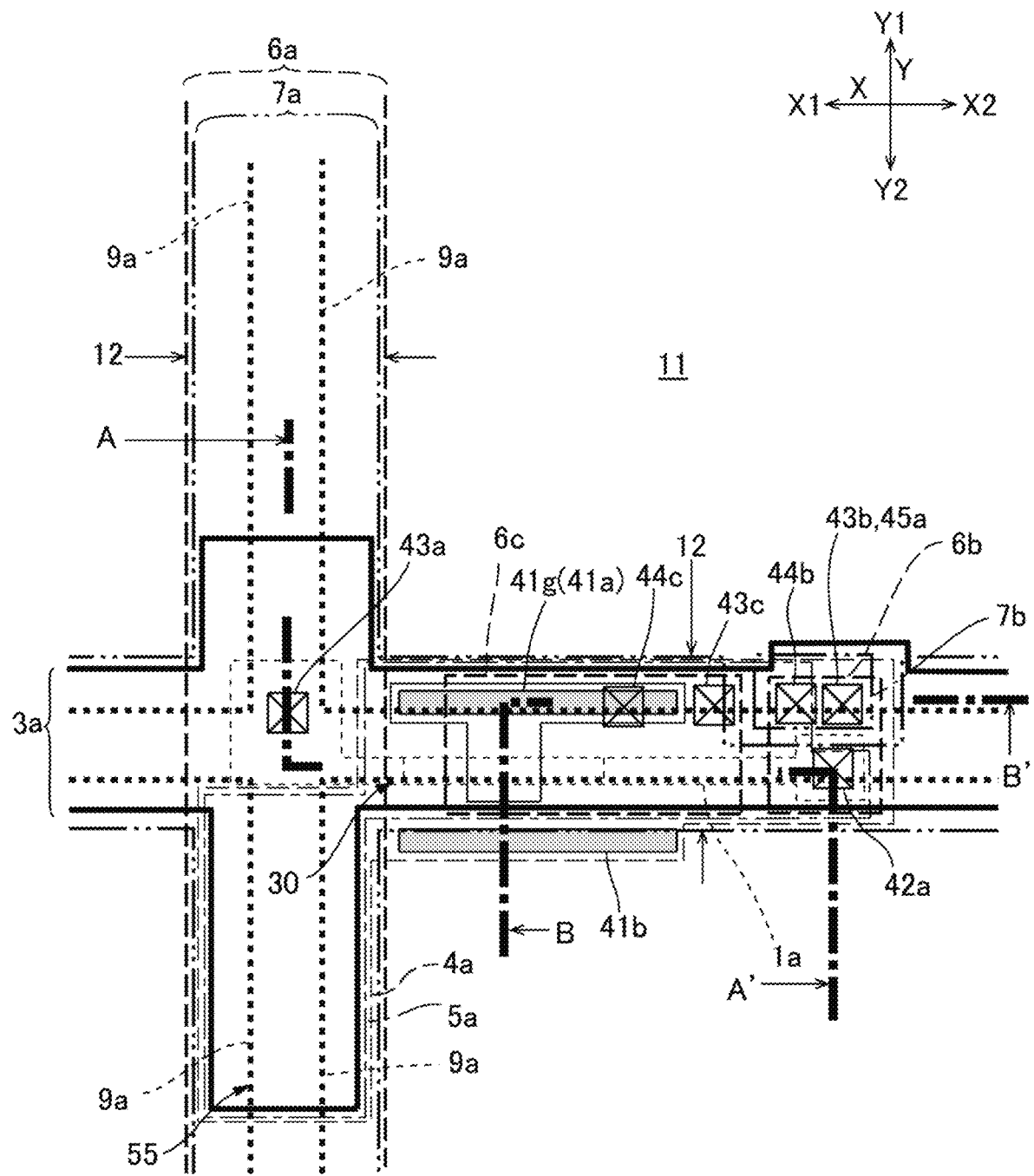
FIG. 4 is an enlarged plan view illustrating one of the pixels illustrated in FIG. 3.
Figure 5:
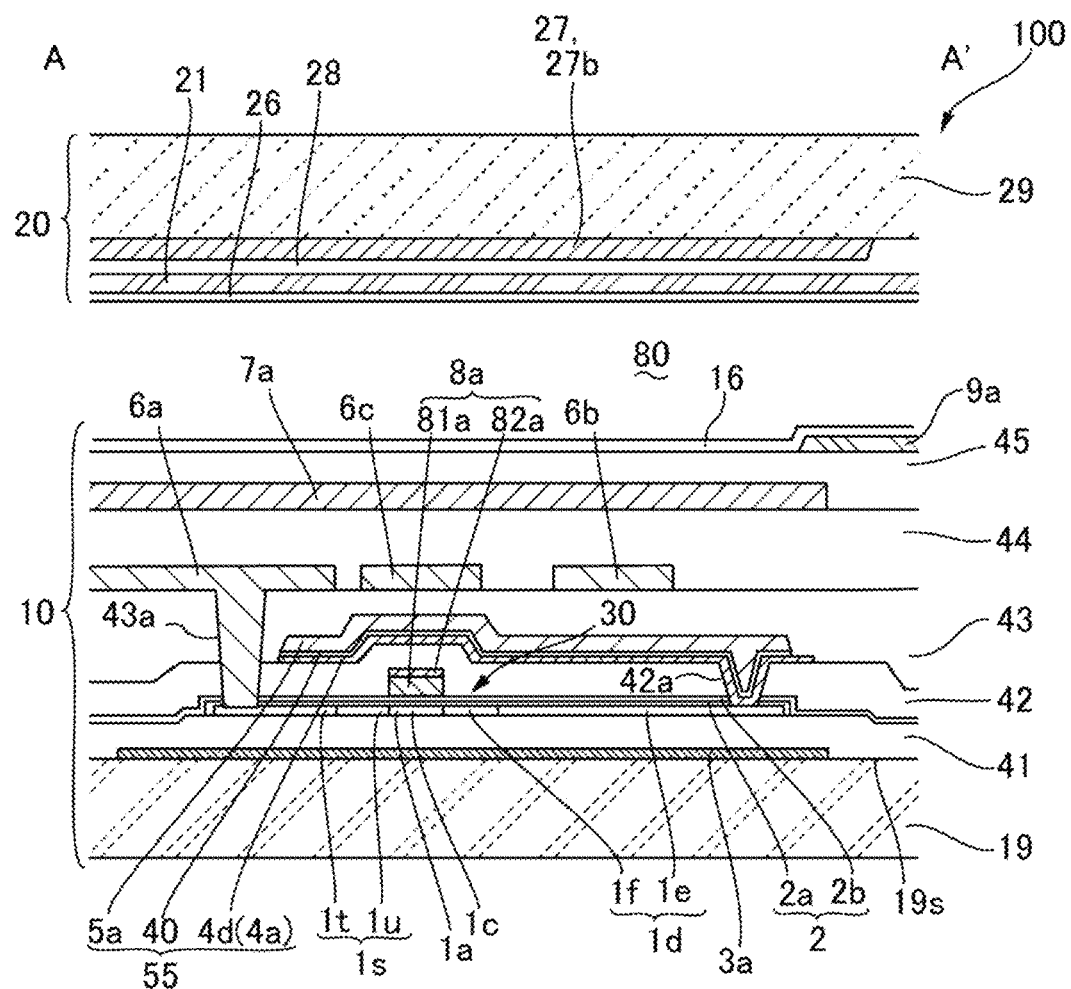
FIG. 5 is a cross-sectional view taken along a line A-A' illustrated in FIG. 4.
Figure 6:
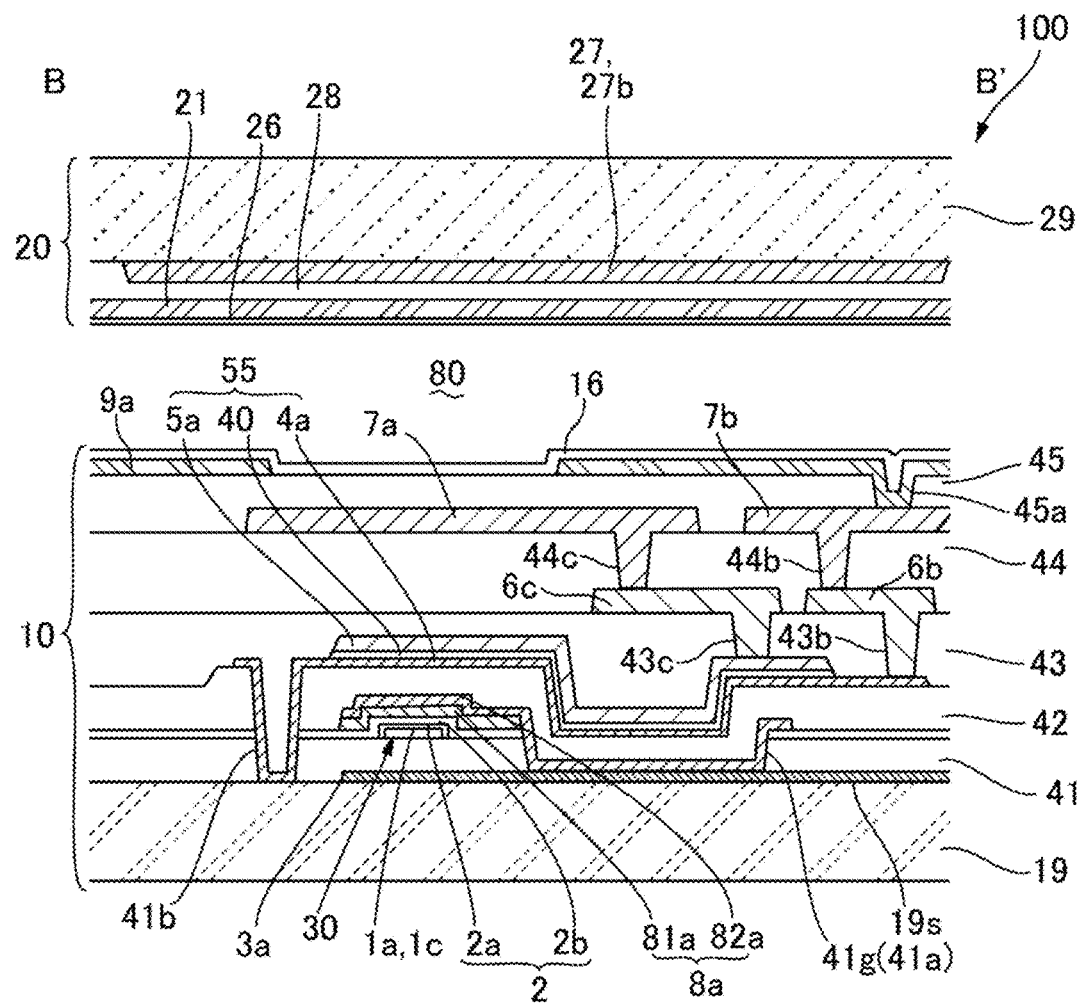
FIG. 6 is a cross-sectional view taken along a line B-B' illustrated in FIG. 4.

FIG. 3 is a plan view of a plurality of pixels adjacent to each other in the electro-optical device 100 illustrated in FIG. 1. FIG. 4 is an enlarged plan view illustrating one of the pixels illustrated in FIG. 3, and an enlarged view around the transistor 30 is illustrated in FIG. 4. FIG. 5 is a cross-sectional view taken along a line A-A' illustrated in FIG. 4. FIG. 6 is a cross-sectional view taken along a line B-B' illustrated in FIG. 4. Note that, in FIG. 3 and FIG. 4, and FIG. 7 to FIG. 9 to be described later, each of the layers are respectively indicated by lines described below. Further, in FIG. 3 and FIG. 4, and FIG. 7 to FIG. 9 to be described later, for the layers whose end portions overlap with each other in plan view, positions of the end portions are shifted to make the shape and the like of the layers easily recognizable. Further, a first opening 41a and a second opening 41b are illustrated by gray regions.

The scanning line 3a is indicated by a thick solid line

A semiconductor layer 1a is indicated by a thin broken line of short dashes.

A gate electrode 8a is indicated by a thin solid line.

A first capacitance electrode 4a is indicated by a thin broken line of long dashes.

A second capacitance electrode 5a is indicated by a thin one-dot chain line.

The data line 6a and relay electrodes 6b and 6c are indicated by thick broken lines of long dashes.

A capacitance line 7a and a relay electrode 7b are indicated by thick two-dot chain lines.

The pixel electrodes 9a are indicated by thick broken lines of short dashes.

As illustrated in FIG. 3 and FIG. 4, the pixel electrode 9a is formed in each of the plurality of pixels on a surface of the first substrate 10 facing the second substrate 20, and the scanning line 3a, the data line 6a, and the capacitance line 7a extend along an inter-pixel region interposed between the pixel electrodes 9a adjacent to each other. The data line 6a extends in the first direction Y in the inter-pixel region, and the scanning line 3a extends in the second direction X in the inter-pixel region. The capacitance line 7a extends in the first direction Y and the second direction X in the inter-pixel region. Further, the transistor 30 is formed corresponding to an intersection between the data line 6a and the scanning line 3a. Here, the scanning line 3a, the data line 6a, and the capacitance line 7a have light shielding properties. Therefore, a region in which the scanning lines 3a, the data lines 6a, the capacitance lines 7a, and electrodes provided in the same layer as those wiring lines are formed is a light shielding region 12 through which light is not transmitted, and regions surrounded by the light shielding region 12 are aperture regions 11 through which light is transmitted.

As illustrated in FIG. 5 and FIG. 6, in the first substrate 10, interlayer insulating layers 41, 42, 43, 44, and 45 are sequentially layered in this order from the substrate main body 19 side, between the substrate main body 19 and the pixel electrodes 9a. Each of the interlayer insulating layers 41, 42, 43, 44, and 45 is formed of a transmissive insulating film such as silicon oxide. In the present exemplary embodiment, surfaces, on the pixel electrode 9a side, of the interlayer insulating layers 43, 44, and 45 are each formed as a continuous flat surface by chemical machine polishing or the like. In the present exemplary embodiment, various wiring lines to be described below and the transistor 30 are provided using a space between the interlayer insulating layer and the substrate main body 19, and spaces between the interlayer insulating layers.

3. Detailed Description of Each Layer

Figure 7:
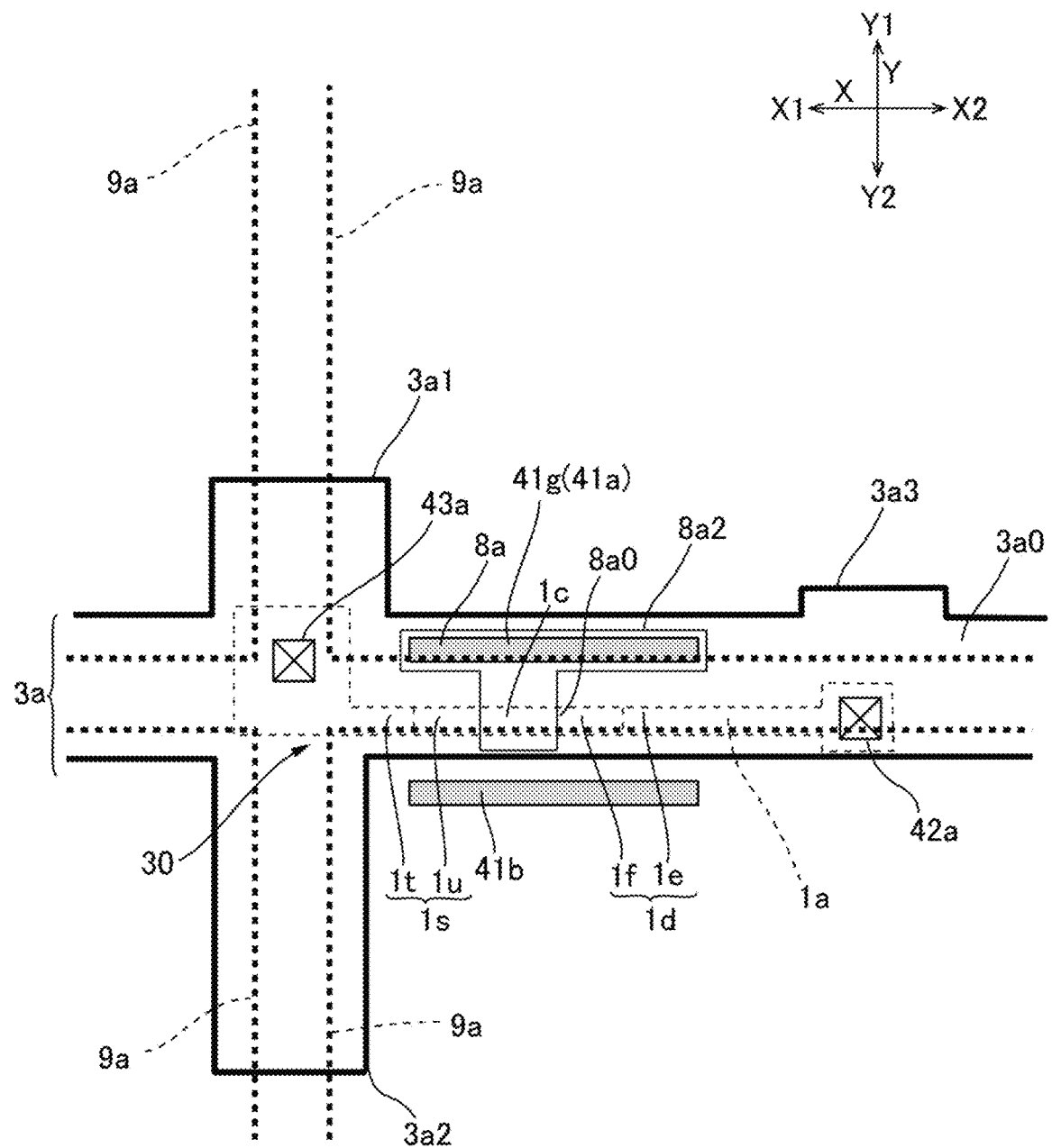
FIG. 7 is a plan view of a scanning line, a semiconductor layer, a gate electrode, and the like illustrated in FIG. 5 and FIG. 6.
Figure 8:
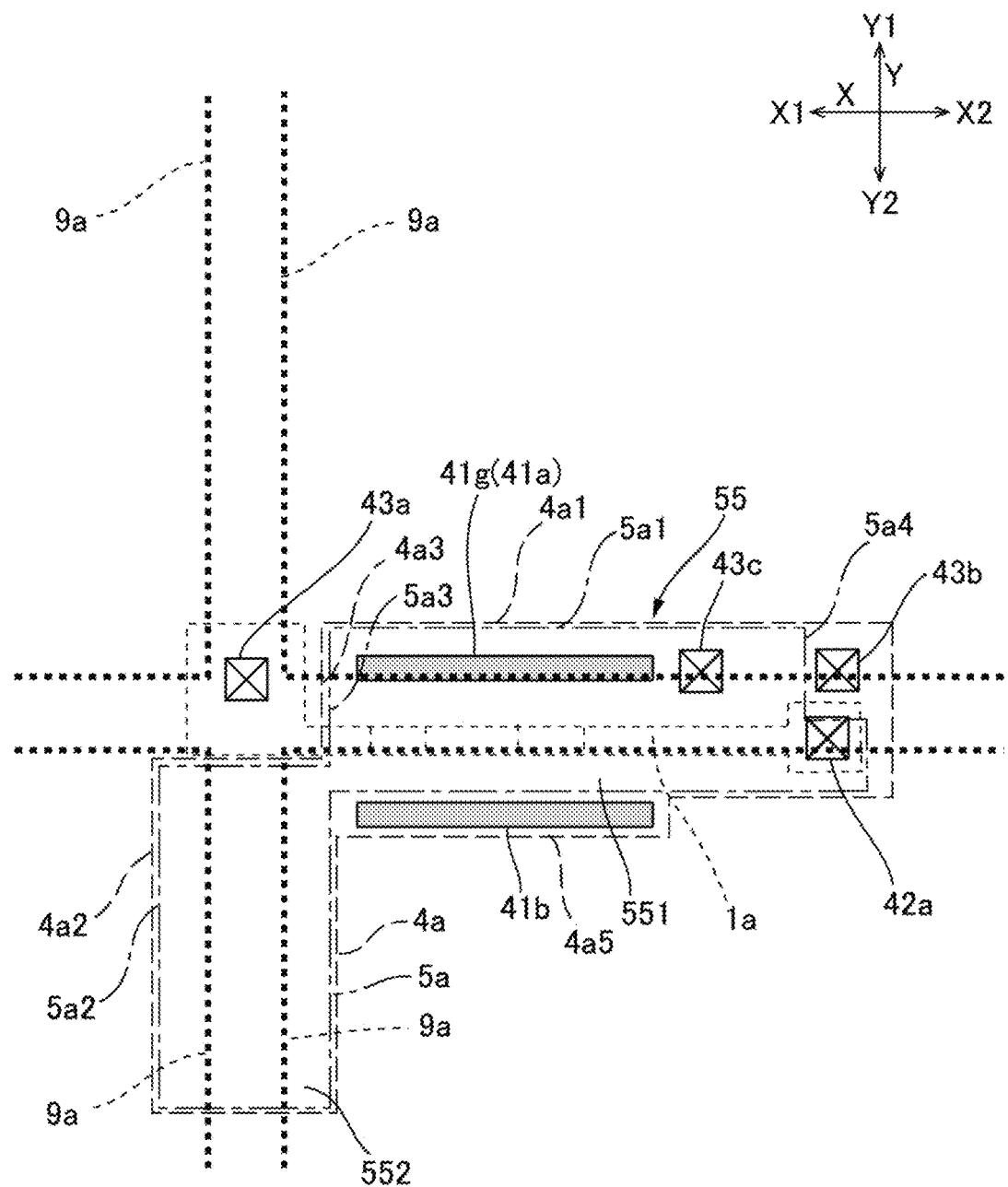
FIG. 8 is a plan view of a first capacitance electrode, a second capacitance electrode, and the like illustrated in FIG. 5 and FIG. 6.
Figure 9:
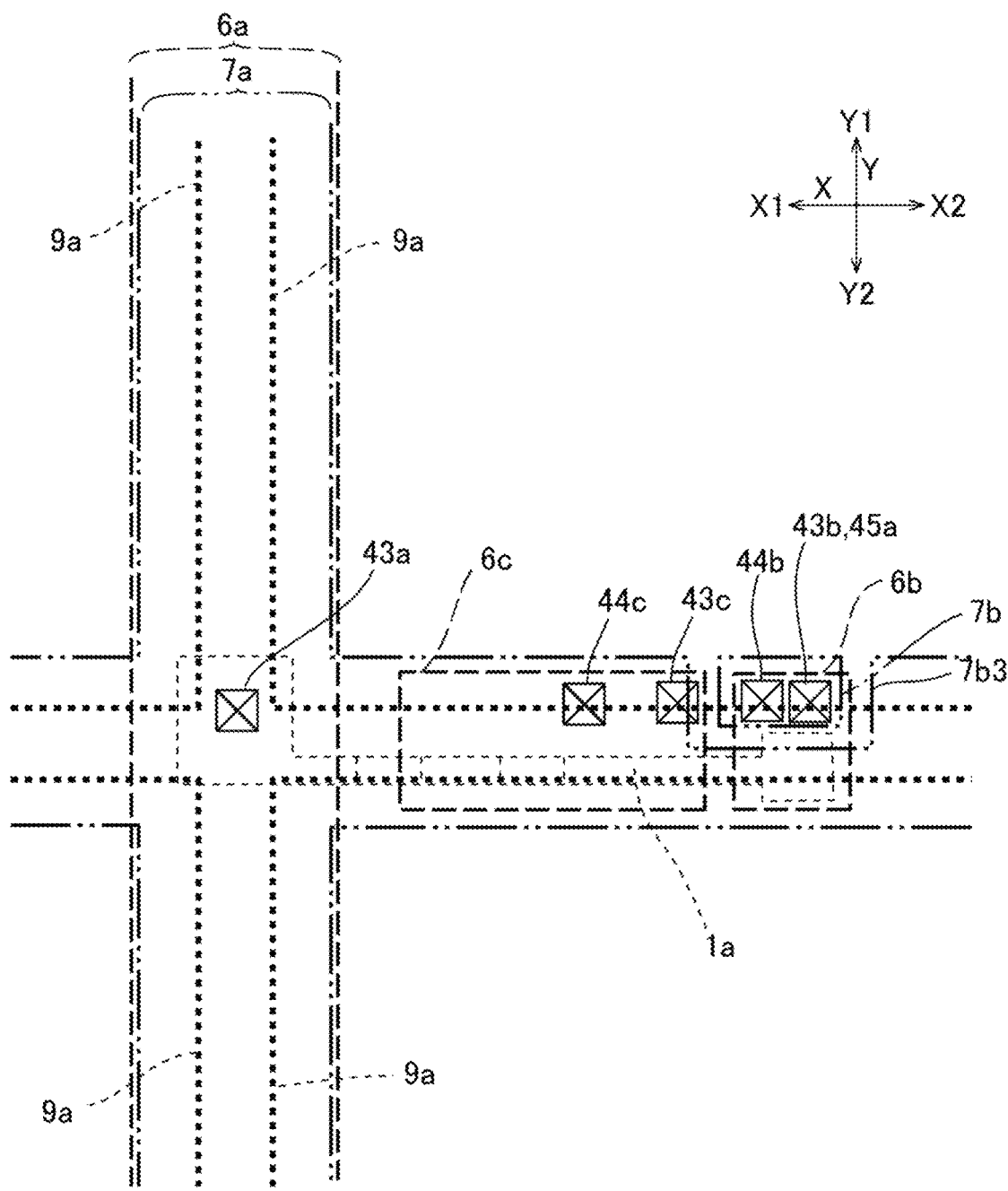
FIG. 9 is a plan view of a data line, a capacitance line, and the like illustrated in FIG. 5 and FIG. 6.

A detailed configuration of the first substrate 10 will be described with reference to FIG. 5 and FIG. 6, while referring as necessary to FIG. 7 to FIG. 9 to be described below. FIG. 7 is a plan view of the scanning line 3a, the semiconductor layer 1a, the gate electrode 8a, and the like illustrated in FIG. 5 and FIG. 6. FIG. 8 is a plan view of the first capacitance electrode 4a, the second capacitance electrode 5a, and the like illustrated in FIG. 5 and FIG. 6. FIG. 9 is a plan view of the data line 6a, the capacitance line 7a, and the like illustrated in FIG. 5 and FIG. 6. Note that, in FIG. 7 to FIG. 9, contact holes relating to electrical coupling of electrodes and the like illustrated in those figures are illustrated, and at the same time, the semiconductor layer 1a and the pixel electrodes 9a are illustrated for the purpose of indicating reference positions.

First, as illustrated in FIG. 5 and FIG. 6, in the first substrate 10, the scanning line 3a extending along the second direction X is formed between the substrate main body 19 and the interlayer insulating layer 41. The scanning line 3a is formed of a conductive film having light shielding properties such as a metal silicide film, a metal film, a metal compound film, or the like. In the present exemplary embodiment, the scanning line 3a is formed from tungsten silicide (WSi), tungsten, titanium nitride, or the like. The transistor 30 for pixel switching is configured between the interlayer insulating layer 41 and the interlayer insulating layer 42. The transistor 30 includes the semiconductor layer 1a formed on the surface of the interlayer insulating layer 41 on the opposite side from the substrate main body 19, a gate insulating layer 2 layered on the pixel electrode 9a side of the semiconductor layer 1a, and the gate electrode 8a overlapping with the semiconductor layer 1a on the pixel electrode 9a side of the gate insulating layer 2 in plan view. The semiconductor layer 1a is formed of a polysilicon film or the like. The gate insulating layer 2 has a two-layer structure configured by a first gate insulating layer 2a that is formed of a silicon oxide film obtained by thermally oxidizing the semiconductor layer 1a, and a second gate insulating layer 2b that is formed of a silicon oxide film formed, for example, by a low pressure CVD method. The gate electrode 8a is formed of a conductive film such as a conductive polysilicon film, a metal silicide film, a metal film, or a metal compound film.

The interlayer insulating layer 41 provided between the scanning line 3a and the transistor 30 is provided with the first opening 41a and the second opening 41b such that the first opening 41a and the second opening 41b are positioned on either side of the semiconductor layer 1a in the width direction of the semiconductor layer 1a in plan view. The first opening 41a is provided as a contact hole 41g that electrically couples the scanning line 3a and the transistor 30. A detailed configuration of the first opening 41a and the second opening 41b will be described below with reference to FIG. 10 to FIG. 12.

As illustrated in FIG. 7, the scanning line 3a includes a wiring portion 3a0 extending linearly along the second direction X, and protruding portions 3a1 and 3a2 that protrude from the wiring portion 3a0 so as to overlap with the data line 6a on both the first side Y1 and the second side Y2 in the first direction Y. Further, the wiring portion 3a0 is provided with a protruding portion 3a3 that protrudes from the wiring portion 3a0 to the first side Y1 in the first direction Y.

The semiconductor layer 1a extends from an intersecting section of the scanning line 3a and the data line 6a to the second side X2 in the second direction X so as to overlap with the scanning line 3a in plan view, and a portion overlapping with the gate electrode 8a in plan view is a channel region 1c. In the present exemplary embodiment, the transistor 30 has a lightly doped drain (LDD) structure. Therefore, on the semiconductor layer 1a, a first region is provided on the first side X1 in the second direction X with respect to the channel region 1c, on which the data line 6a is located, includes a data line-side source drain region 1t separated from the channel region 1c, and a data line-side LDD region 1u interposed between the data line-side source drain region 1t and the channel region 1c. The data line-side LDD region 1u has a lower impurity concentration than the data line-side source drain region 1t. Further, on the semiconductor layer 1a, a second region 1d provided on the second side X2 in the second direction X with respect to the channel region 1c, which is the opposite side from the data line 6a, includes a pixel electrode-side source drain region 1e separated from the channel region 1c, and a pixel electrode-side LDD region 1f interposed between the pixel electrode-side source drain region 1e and the channel region 1c. The pixel electrode-side LDD region if has a lower impurity concentration than the pixel electrode-side source drain region 1e.

The gate electrode 8a includes a first electrode portion 8a0 extending in the first direction Y so as to overlap with the semiconductor layer 1a in plan view with the gate insulating layer 2 interposed therebetween, and a second electrode portion 8a2 extending in the second direction X along the semiconductor layer 1a from an end portion, on the first side Y1 in the first direction Y, of the first electrode portion 8a0 on both sides of the semiconductor layer 1a in the first direction Y. The second electrode portion 8a2 does not overlap with the semiconductor layer 1a in plan view.

Returning to FIG. 5 and FIG. 6 again, the interlayer insulating layers 42 and 43 are formed on the upper layer side of the transistor 30. A capacitance element 55 is provided between the interlayer insulating layer 42 and the interlayer insulating layer 43, and in the capacitance element 55, the first capacitance electrode 4a, a dielectric layer 40, and the second capacitance electrode 5a are sequentially layered in this order. The capacitance element 55 is a retention capacitor that prevents fluctuations in image signals retained by a liquid crystal capacitor, which is configured between the pixel electrode 9a of the first substrate 10 and the common electrode 21 of the second substrate 20. The first capacitance electrode 4a and the second capacitance electrode 5a are each formed of a conductive film having light shielding properties such as a metal silicide film, a metal film, a metal compound film, or the like.

As illustrated in FIG. 8, the first capacitance electrode 4a includes a main body portion 4a1 extending in the second direction X so as to overlap with the scanning line 3a and the semiconductor layer 1a in plan view, and a protruding portion 4a2 protruding from the main body portion 4a1 so as to overlap with the data line 6a in plan view. An end portion of the main body portion 4a1 is electrically coupled to the pixel electrode-side source drain region 1e of the semiconductor layer 1a via a contact hole 42a formed in the interlayer insulating layer 42. The first capacitance electrode 4a is provided with a notch 4a3 so as not to overlap in plan view with an end portion, overlapping with the data line 6a, of the semiconductor layer 1a.

The second capacitance electrode 5a includes a main body portion 5a1 that overlaps with the main body portion 4a1 of the first capacitance electrode 4a in plan view, and a protruding portion 5a2 overlapping with the protruding portion 4a2 of the first capacitance electrode 4a in plan view. Therefore, the capacitance element 55 includes a first element portion 551 extending in the second direction X so as to overlap with the semiconductor layer 1a, and a second element portion 552 extending in the first direction Y so as to overlap with the data line 6a. Further, similarly to the first capacitance electrode 4a, the second capacitance electrode 5a is provided with a notch 5a3 so as not to overlap with the end portion, overlapping with the data line 6a, of the semiconductor layer 1a in plan view. Further, in an end portion, on the second side X2 in the second direction X, of the main body portion 5a1 of the second capacitance electrode 5a, a notch portion 5a4 is formed such that the second capacitance electrode 5a does not overlap with the end portion of the main body portion 4a1 of the first capacitance electrode 4a.

Returning to FIG. 5 and FIG. 6 again, the interlayer insulating layers 44 and 45 are formed on the upper layer side of the interlayer insulating layer 43. In the space between the interlayer insulating layer 43 and the interlayer insulating layer 44, the data line 6a and the relay electrodes 6b and 6c are provided. The data line 6a and the relay electrodes 6b and 6c are formed of the same conductive film. The data line 6a and the relay electrodes 6b and 6c are each formed of a conductive film having light shielding properties such as a metal silicide film, a metal film, a metal compound film, or the like. For example, the data line 6a and the relay electrodes 6b and 6c are formed by a multilayer structure of a titanium layer/a titanium nitride layer/an aluminum layer/a titanium nitride layer, or a multilayer structure of a titanium nitride layer/an aluminum layer/a titanium nitride layer.

A contact hole 43a is provided in the interlayer insulating layers 42 and 43, and the contact hole 43a penetrates through the interlayer insulating layers 42 and 43 and the gate insulating layer 2. The data line 6a is electrically coupled to the data line-side source drain region 1t via the contact hole 43a. The contact hole 43a is formed in a section corresponding to the notch 4a3 of the first capacitance electrode 4a and the notch 5a3 of the second capacitance electrode 5a, which are described above with reference to FIG. 8. Therefore, the contact hole 43a and the capacitance element 55 can be separated from each other. A contact hole 43b is provided in the interlayer insulating layer 43, and the relay electrode 6b is electrically coupled to the first capacitance electrode 4a via the contact hole 43b. The contact hole 43b is formed in a section corresponding to the notch 5a4 of the second capacitance electrode 5a, which is described above with reference to FIG. 8. A contact hole 43c is provided in the interlayer insulating layer 43, and the relay electrode 6c is electrically coupled to the second capacitance electrode 5a via the contact hole 43c.

In the space between the interlayer insulating layer 44 and the interlayer insulating layer 45, the capacitance line 7a and the relay electrode 7b are provided. The capacitance line 7a and the relay electrode 7b are formed of the same conductive film. The capacitance line 7a and the relay electrode 7b are each formed of a conductive film having light shielding properties such as a metal silicide film, a metal film, a metal compound film, or the like. For example, the capacitance line 7a and the relay electrode 7b are formed by the multilayer structure of a titanium layer/a titanium nitride layer/an aluminum layer/a titanium nitride layer, or the multilayer structure of a titanium nitride layer/an aluminum layer/a titanium nitride layer.

A contact hole 44c is provided in the interlayer insulating layer 44, and the capacitance line 7a is electrically coupled to the relay electrode 6c via the contact hole 44c. Therefore, the capacitance line 7a is electrically coupled to the second capacitance electrode 5a via the relay electrode 6c, and the common potential is applied to the second capacitance electrode 5a from the capacitance line 7a. A contact hole 44b is provided in the interlayer insulating layer 44, and the relay electrode 7b is electrically coupled to the relay electrode 6b via the contact hole 44b.

A contact hole 45a is provided in the interlayer insulating layer 45, and the pixel electrode 9a is electrically coupled to the relay electrode 7b via the contact hole 45a. Therefore, the pixel electrode 9a is electrically coupled to the first capacitance electrode 4a via the relay electrodes 7b and 6b. Here, since the first capacitance electrode 4a is electrically coupled to the pixel electrode-side source drain region 1e via the contact hole 42a, the pixel electrode 9a is electrically coupled to the pixel electrode-side source drain region 1e via the first capacitance electrode 4a.

Figure 10:
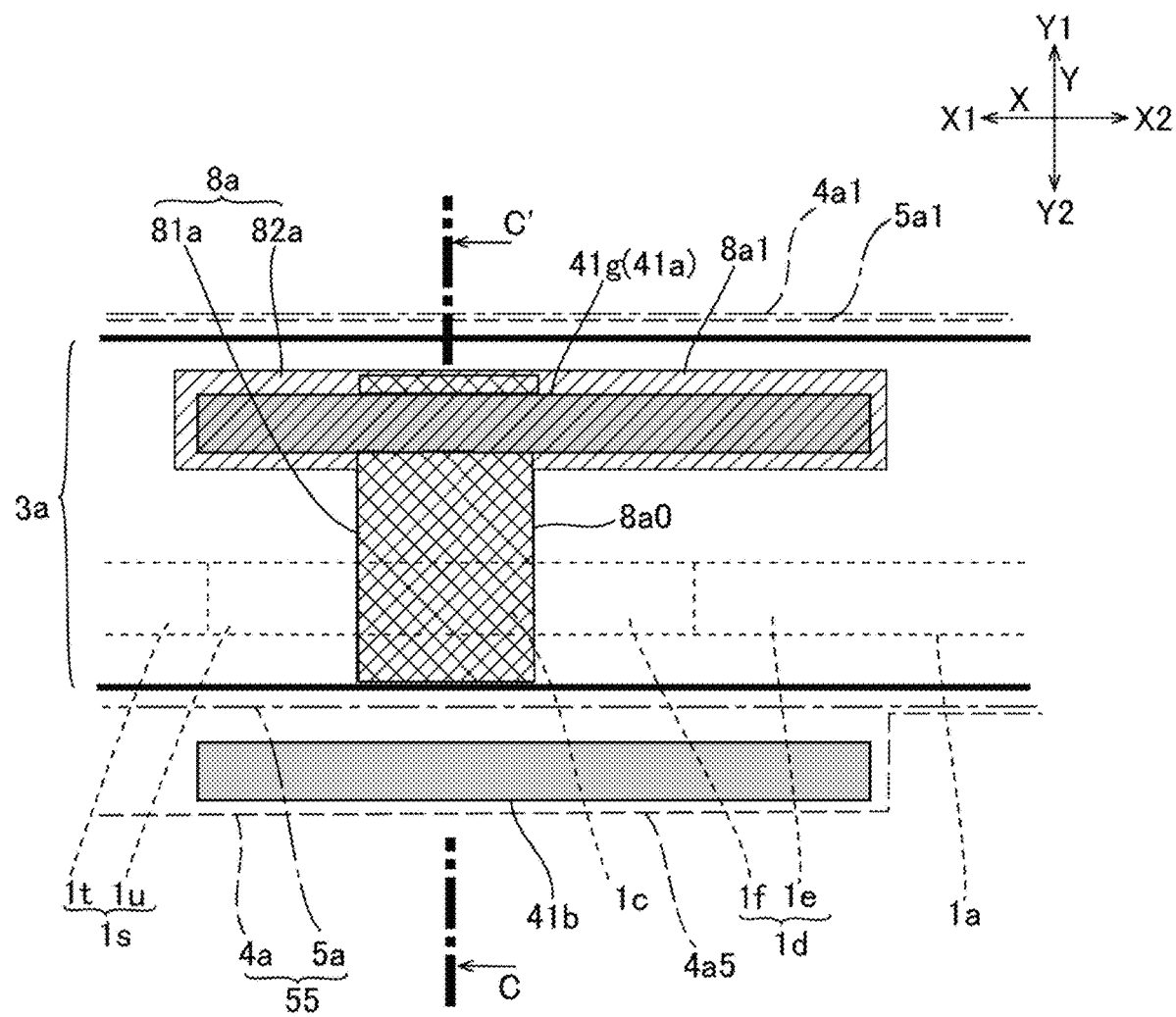
FIG. 10 is an enlarged plan view of the periphery of a first opening and a second opening illustrated in FIG. 7.
Figure 11:
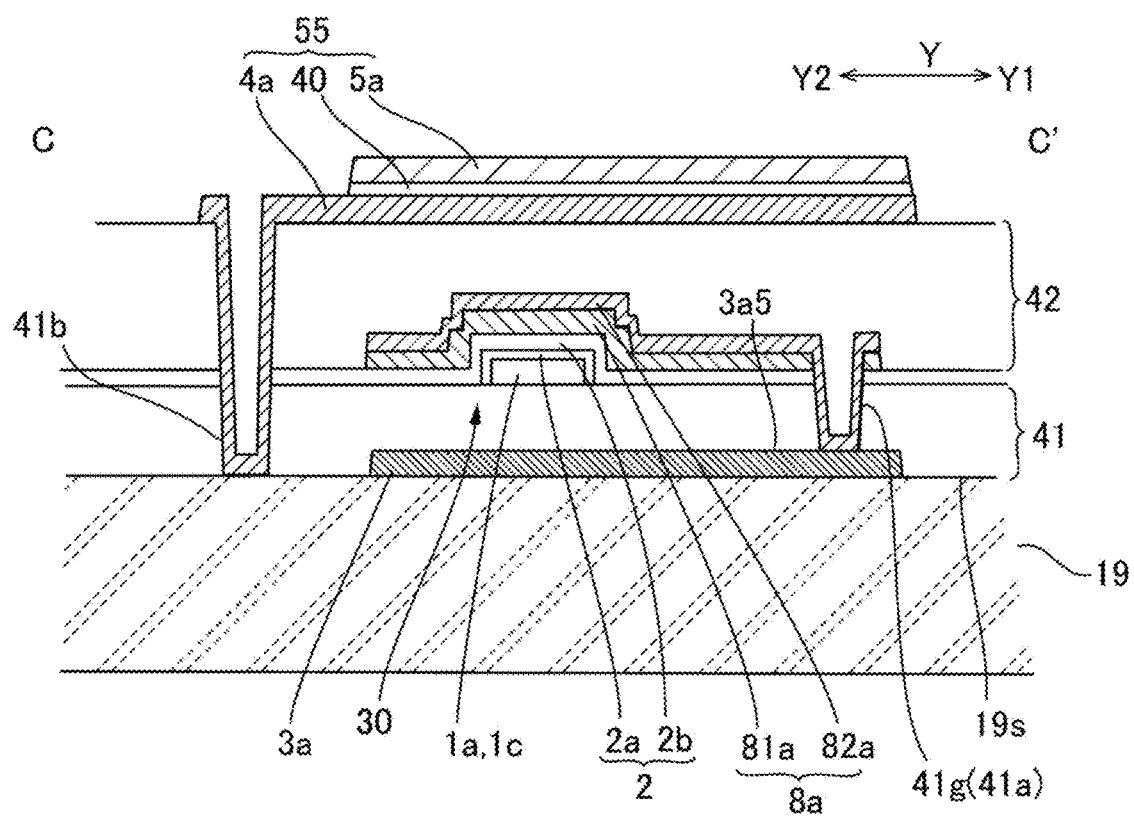
FIG. 11 is a cross-sectional view taken along a line C-C' illustrated in FIG. 10.

4. Detailed Configuration of First Opening 41a, Second Opening 41b, and the Like FIG. 10 is an enlarged plan view of the periphery of the first opening 41a and the second opening 41b illustrated in FIG. 7. FIG. 11 is a cross-sectional view taken along a line C-C' illustrated in FIG. 10. The gate electrode 8a is formed by layering a polysilicon layer 81a and a light shielding layer 82a. Note that in FIG. 10, the polysilicon layer 81a is hatched by diagonal lines sloping downward to the right, and the light shielding layer 82a is hatched by diagonal lines sloping upward to the right. Therefore, a region hatched by both the diagonal lines sloping downward to the right and the diagonal lines sloping upward to the right indicates that both the polysilicon layer 81a and the light shielding layer 82a are layered in the region.

As illustrated in FIG. 10 and FIG. 11, the first opening 41a and the second opening 41b extend along the second direction X on both sides of the semiconductor layer 1a such that the semiconductor layer 1a is interposed therebetween on both sides in the first direction Y. The first opening 41a and the second opening 41b are provided at least along the pixel electrode-side LDD region 1f. In the present exemplary embodiment, the first opening 41a and the second opening 41b at least extend from both sides of the data line-side LDD region 1u to both sides of the pixel electrode-side LDD region 1f, via both sides of the channel region 1c.

Here, of both sides of the semiconductor layer 1a, the first opening 41a on the first side Y1 side in the first direction Y is formed so as to overlap with the gate electrode 8a and the scanning line 3a in plan view. Therefore, a portion of the gate electrode 8a is formed along an inner wall of the first opening 41a, and configures a light shielding wall. Further, a portion of the gate electrode 8a is in contact with a surface 3a5 provided on the semiconductor layer 1a side of the scanning line 3a, via the first opening 41a, and the gate electrode 8a is electrically coupled to the scanning line 3a via the first opening 41a. Thus, the first opening 41a is configured to be the contact hole 41g that electrically couples the gate electrode 8a and the scanning line 3a, and a scanning signal is applied to the gate electrode 8a from the scanning line 3a.

The gate electrode 8a is configured by layering the conductive polysilicon layer 81a that extends in the first direction Y so as to intersect with the semiconductor layer 1a, and the light shielding layer 82a covering the polysilicon layer 81a. The light shielding layer 82a is formed from a material having higher light shielding properties than the polysilicon layer 81a. For example, the light shielding layer 82a is formed of a light shielding film such as a tungsten silicide.

The light shielding layer 82a is formed over a wider area than the polysilicon layer 81a and covers the entire polysilicon layer 81a. Therefore, in a region of the gate electrode 8a in which the polysilicon layer 81a is formed, the polysilicon layer 81a and the light shielding layer 82a are provided forming a two-layer structure, and in a region of the gate electrode 8a in which the polysilicon layer 81a is not formed, only the light shielding layer 82a is provided forming a single-layer structure. For example, in the gate electrode 8a, the polysilicon layer 81a is not formed inside the first opening 41a, and the interior of the first opening 41a has the single-layer structure of the light shielding layer 82a. Therefore, the light shielding layer 82a is provided along the entire inner wall of the first opening 41a. On the other hand, of the first electrode portion 8a0 that extends in the first direction Y in the gate electrode 8a, a portion outside the first opening 41a has the two-layer structure configured by the polysilicon layer 81a and the light shielding layer 82a. Note that portions provided on both sides in the extending direction of the first opening 41a have the single-layer structure configured by the light shielding layer 82a.

Of both sides of the semiconductor layer 1a, the second opening 41b on the second side Y2 in the first direction Y does not overlap with the gate electrode 8a and the scanning line 3a in plan view, and is separated from the gate electrode 8a and the scanning line 3a to the second side Y2 in the first direction Y. In the present exemplary embodiment, the second opening 41b is formed at a position overlapping, in plan view, with one of the capacitance electrodes, namely, one of the first capacitance electrode 4a and the second capacitance electrode 5a of the capacitance element 55. In the present exemplary embodiment, a protruding portion 4a5 protruding from the main body portion 4a1 to the second side Y2 in the first direction Y is formed in the first capacitance electrode 4a, and the protruding portion 4a5 protrudes so as to overhang from the scanning line 3a and overlap with the second opening 41b in plan view. Further, the second opening 41b is formed so as to penetrate the interlayer insulating layer 42, the gate insulating layer 2, and the interlayer insulating layer 41. Therefore, a portion of the first capacitance electrode 4a is formed along the inner wall of the second opening 41b, and configures a light shielding wall. Here, the second opening 41b is in contact with the first surface 19s of the substrate main body 19 at a position separated from the scanning line 3a to the second side Y2 in the first direction Y, and is not in contact with the scanning line 3a. In order to achieve such a configuration, in the present exemplary embodiment, the semiconductor layer 1a is provided at a position biased from the center of the scanning line 3a in the width direction toward the second side Y2, namely the other side of the scanning line 3a, in the first direction Y. In other words, the semiconductor layer 1a is provided at a position biased from the center of the scanning line 3a toward the second opening 41b side in the width direction. Thus, a distance between the semiconductor layer 1a and the second opening 41b and a distance between the semiconductor layer 1a and the first opening 41a are the same. Therefore, the gate electrode 8a provided inside the first opening 41a and the first capacitance electrode 4a provided inside the second opening 41b have similar light shielding properties with respect to the semiconductor layer 1a.

5. Method for Manufacturing Electro-Optical Device 100

Figure 12:
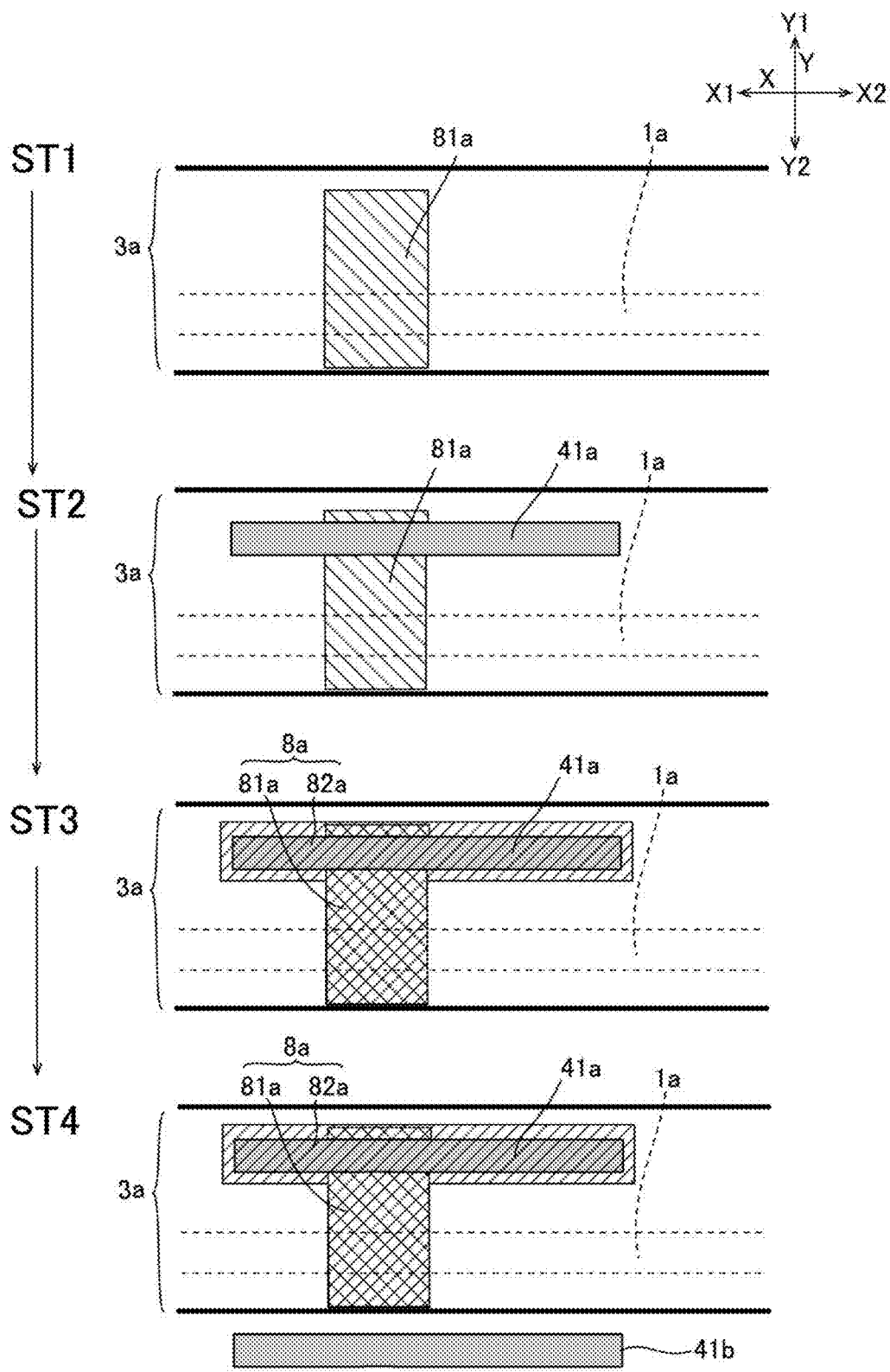
FIG. 12 is an explanatory diagram illustrating a method for manufacturing the electro-optical device illustrated in FIG. 1.

FIG. 12 is an explanatory diagram illustrating a method for manufacturing the electro-optical device 100 illustrated in FIG. 1, and is an explanatory diagram illustrating steps for forming the gate electrode 8a. In order to achieve the structure illustrated in FIG. 10 and FIG. 11, after forming the scanning line 3a, the interlayer insulating layer 41, the semiconductor layer 1a, and the gate insulating layer 2, a conductive polysilicon film is formed. Next, at step ST1 illustrated in FIG. 12, the polysilicon film is patterned to form the polysilicon layer 81a that extends in the first direction Y intersecting with the semiconductor layer 1a.

Next, at step ST2 illustrated in FIG. 12, in a state in which an etching mask is formed, the polysilicon layer 81a and the interlayer insulating layer 41 are etched to form the first opening 41a. Next, at step ST3 illustrated in FIG. 12, after forming a light shielding film, the light shielding film is patterned to form the light shielding layer 82a, as illustrated in FIG. 10.

Next, at step ST4 illustrated in FIG. 12, after forming the interlayer insulating layer 42, in a state in which an etching mask is formed, the interlayer insulating layers 41 and 42 and the gate insulating layer 2 are etched to form the second opening 41b. Therefore, the polysilicon layer 81a is not present inside the first opening 41a and the second opening 41b.

Next, after forming a conductive film for forming the first capacitance electrode 4a, the conductive film is patterned to form the first capacitance electrode 4a, as illustrated in FIG. 10.

6. Main Effects of Present Exemplary Embodiment

As described above, in the electro-optical device 100 according to the present exemplary embodiment, light incident from the second substrate 20 side is blocked by the wiring lines, such as the data lines 6a and the capacitance lines 7a provided on the second substrate 20 side with respect to the semiconductor layer 1a, and the capacitance element 55. Thus, incidence of the light on the semiconductor layer 1a is suppressed. Further, even when light emitted from the first substrate 10 side enters once again from the first substrate 10 side, the light is blocked by the scanning lines 3a provided on the substrate main body 19 side with respect to the semiconductor layer 1a, so incidence of the light on the semiconductor layer 1a is suppressed.

Further, with respect to light traveling in the first direction Y intersecting with the semiconductor layer 1a, since the gate electrode 8a and the first capacitance electrode 41a respectively configure a light shielding wall inside the first opening 41a and the second opening 41b, incidence of the light on the semiconductor layer 1a is suppressed. In particular, in the present exemplary embodiment, by providing the pixel electrode-side LDD region 1f between the channel region 1c and the pixel electrode-side source drain region 1e, an off-leak current of the transistor 30 is reduced, and at the same time, the light shielding wall is configured by the gate electrode 8a and the first capacitance electrode 4a provided inside the first opening 41a and the second opening 41b. Therefore, light traveling toward the pixel electrode-side LDD region 1f can be efficiently blocked, and the transistor 30 can thus sufficiently exhibit characteristics of the LDD structure.

Further, in the present exemplary embodiment, of the first opening 41a and the second opening 41b provided on both sides of the semiconductor layer 1a, only the first opening 41a overlaps with the scanning line 3a in plan view, and the second opening 41b does not overlap with the scanning line 3a in plan view. Thus, the width of the scanning line 3a can be made narrower compared with a case in which both the first opening 41a and the second opening 41b are disposed so as to overlap with the scanning line 3a in plan view. Further, of the first opening 41a and the second opening 41b provided on both sides of the semiconductor layer 1a, the gate electrode 8a is provided in the first opening 41a only, and the first capacitance electrode 4a having the same potential as the pixel electrode 9a and the pixel electrode-side source drain region 1e is provided in the second opening 41b. Thus, even when the first opening 41a and the second opening 41b are brought closer to the semiconductor layer 1a, the gate electrode 8a and the semiconductor layer 1a are less likely to affect each other electrically. Therefore, an interval between the first opening 41a and the second opening 41b can be narrowed. Thus, the width of the scanning line 3a can be made narrower. For example, as in the present exemplary embodiment, the width of the scanning line 3a can be made narrower than the width of the data line 6a. Thus, a reduction in a pixel aperture ratio, which is a proportion of the aperture regions 11 illustrated in FIG. 3, can be avoided, and thus, utilization efficiency of light can be increased.

Further, the gate electrode 8a includes the conductive polysilicon layer 81a and the light shielding layer 82a, and the light shielding layer 82a is provided along the inner wall of the first opening 41a. Thus, high light shielding properties are obtained in the first opening 41a.

Second Exemplary Embodiment

Figure 13:
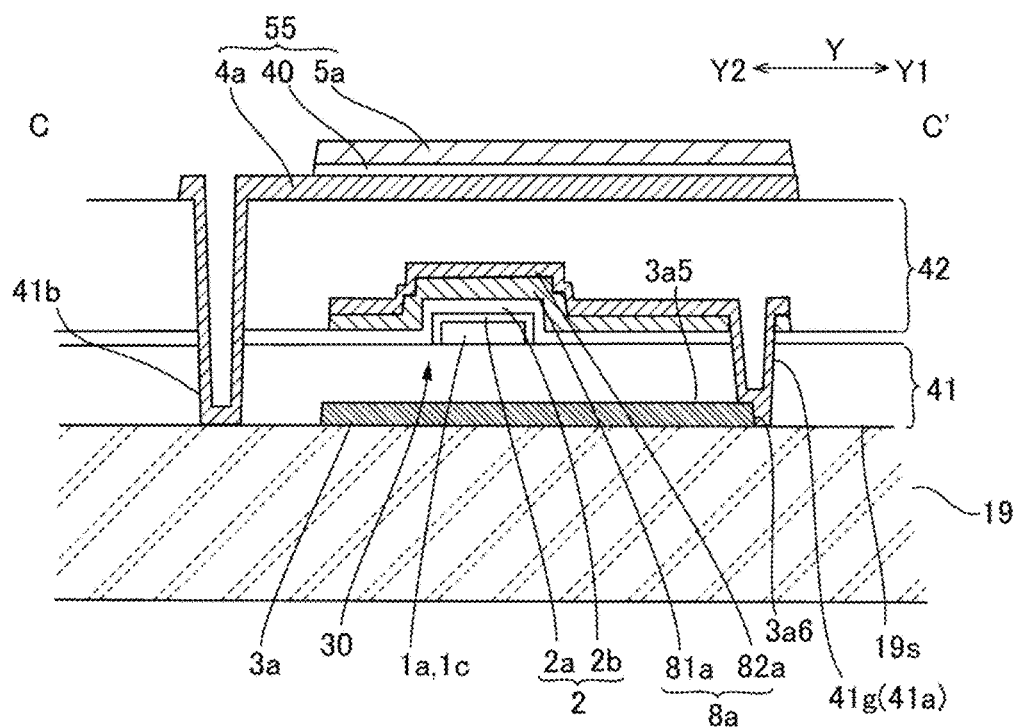
FIG. 13 is an explanatory diagram illustrating the electro-optical device according to a second exemplary embodiment of the present disclosure.

FIG. 13 is an explanatory diagram illustrating the electro-optical device according to a second exemplary embodiment of the present disclosure. FIG. 13 illustrates an enlarged cross-section of the periphery of the second contact hole 41g, which corresponds to the cross section taken along the line C-C' illustrated in FIG. 4. Note that basic configurations in this exemplary embodiment are the same as those of the first exemplary embodiment, and thus, common portions will be denoted by the same reference signs and a description of the common portions will be omitted.

As illustrated in FIG. 13, in the electro-optical device according to the present exemplary embodiment, similarly to the first exemplary embodiment, the first opening 41a overlaps with the scanning line 3a in plan view, and the second opening 41b does not overlap with the scanning line 3a in plan view. In the present exemplary embodiment, only a portion of the first opening 41a overlaps with the scanning line 3a in plan view. Therefore, the gate electrode 8a is in contact with the surface 3a5, on the semiconductor layer 1a side, of the scanning line 3a and a side surface 3a6 of the scanning line 3a. According to such a configuration, while using the scanning line 3a as an etching stopper, the first opening 41a is formed to a deep position. Thus, the scanning line 3a can be reliably exposed at the bottom of the first opening 41a. Therefore, the gate electrode 8a can be reliably electrically coupled to the scanning line 3a via the first opening 41a.

Third Exemplary Embodiment

Figure 14:
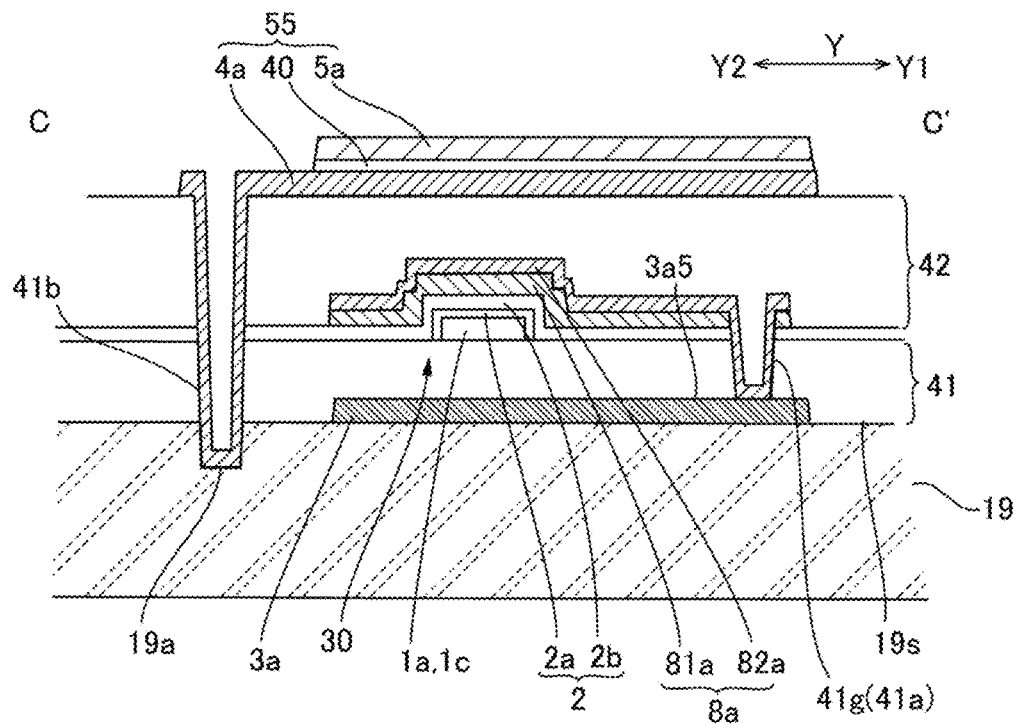
FIG. 14 is an explanatory diagram illustrating the electro-optical device according to a third exemplary embodiment of the present disclosure.

FIG. 14 is an explanatory diagram illustrating the electro-optical device according to a third exemplary embodiment of the present disclosure. FIG. 14 illustrates an enlarged cross section of the periphery of the second contact hole 41g, which corresponds to the cross section taken along the line C-C' illustrated in FIG. 4. Note that basic configurations in this exemplary embodiment are the same as those of the first exemplary embodiment, and thus, common portions will be denoted by the same reference signs and a description of the common portions will be omitted.

As illustrated in FIG. 14, in the electro-optical device according to the present exemplary embodiment, similarly to the first exemplary embodiment, the first opening 41a overlaps with the scanning line 3a in plan view, and the second opening 41b does not overlap with the scanning line 3a in plan view. In the present exemplary embodiment, the second opening 41b is provided to a position deeper than a surface of the scanning line 3a on the opposite side from the semiconductor layer 1a. More specifically, the second opening 41b penetrates the interlayer insulating layer 41, and reaches the substrate main body 19. Therefore, in the substrate main body 19, a hole 19a, which is formed when forming the second opening 41b by etching, is formed at a position overlapping with the second opening 41b. According to such a configuration, while using the scanning line 3a as an etching stopper, the first opening 41a is formed to a deep position. Thus, the scanning line 3a can be reliably exposed at the bottom of the first opening 41a. Therefore, the gate electrode 8a can be reliably electrically coupled to the scanning line 3a via the first opening 41a. Such a configuration may be applied to the electro-optical device according to the second exemplary embodiment.

Fourth Exemplary Embodiment

Figure 15:
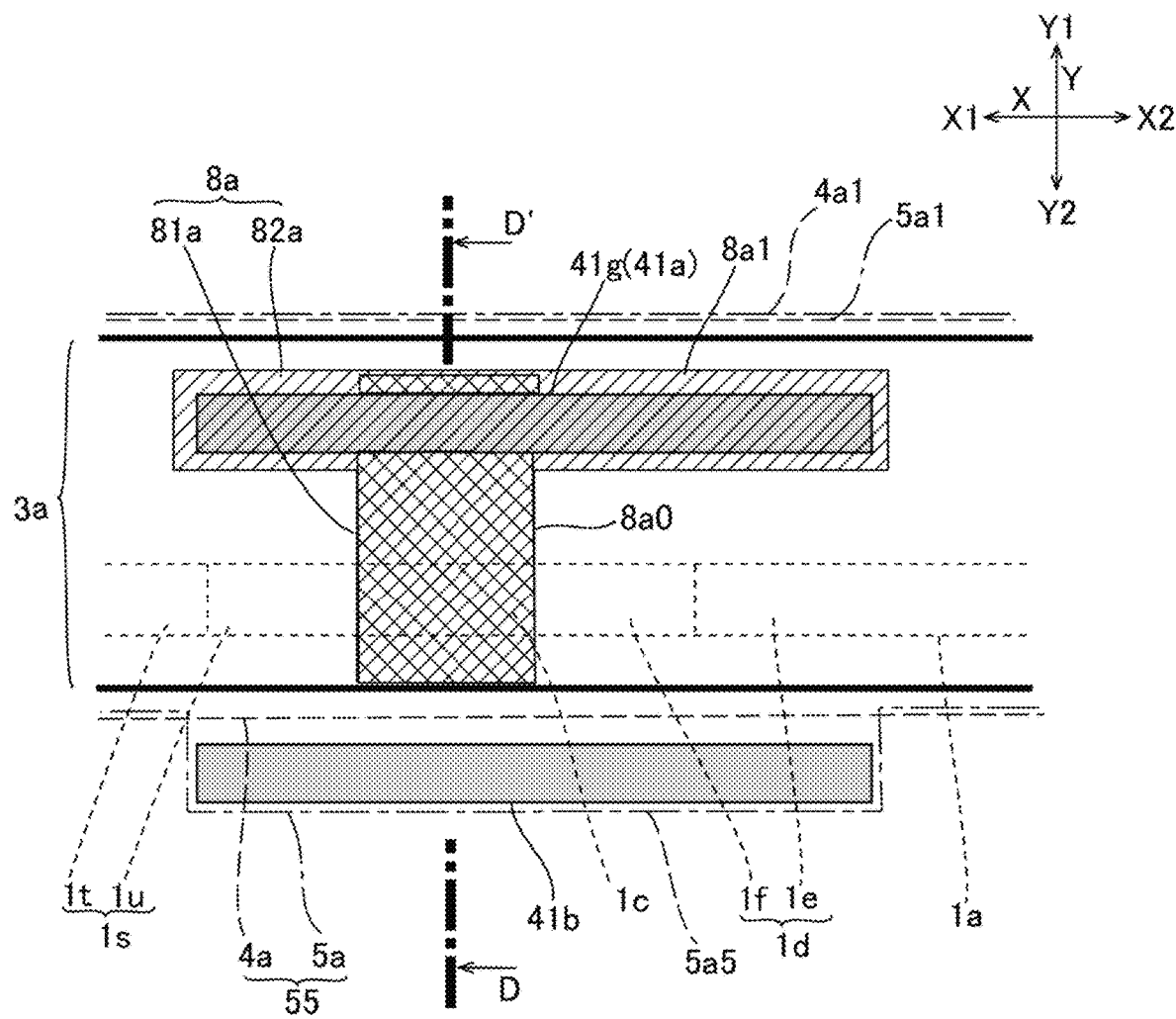
FIG. 15 is an explanatory diagram illustrating the electro-optical device according to a fourth exemplary embodiment of the present disclosure.
Figure 16:
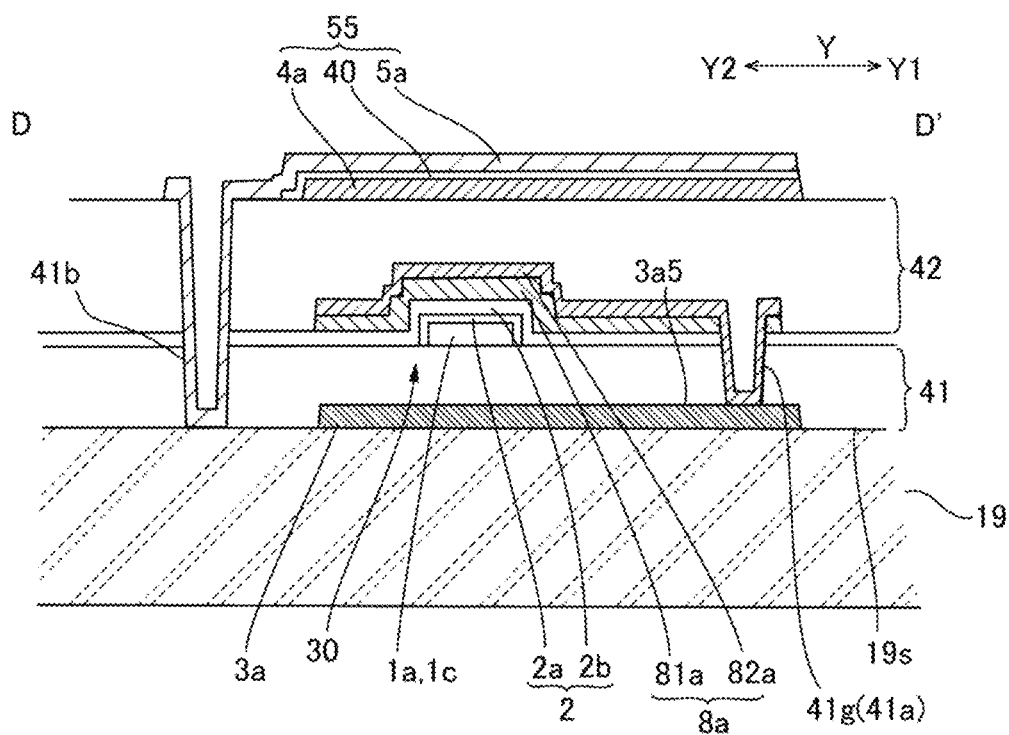
FIG. 16 is a cross-sectional view taken along a line D-D' illustrated in FIG. 15.

FIG. 15 is an explanatory diagram illustrating the electro-optical device according to a fourth exemplary embodiment of the present disclosure, and in FIG. 15, a flat surface in the vicinity of the first opening 41a and the second opening 41b is illustrated in an enlarged manner. FIG. 16 is a cross-sectional view taken along a line D-D' illustrated FIG. 15. Note that basic configurations in this exemplary embodiment are the same as those of the first exemplary embodiment, and thus, common portions will be denoted by the same reference signs and a description of the common portions will be omitted. In the first exemplary embodiment and the like, the portion of the first capacitance electrode 4a is provided inside the second opening 41b, but in the present exemplary embodiment, as will be described below, a portion of the second capacitance electrode 5a is provided inside the second opening 41b.

As illustrated in FIG. 15 and FIG. 16, in the electro-optical device according to the present exemplary embodiment, similarly to the first exemplary embodiment, the first opening 41a overlaps with the scanning line 3a in plan view, and the second opening 41b does not overlap with the scanning line 3a in plan view. In the present exemplary embodiment, a portion of the gate electrode 8a is formed along the inner wall of the first opening 41a, and configures a light shielding wall. Further, the gate electrode 8a is electrically coupled to the scanning line 3a via the first opening 41a. On the other hand, in the second capacitance electrode 5a, a protruding portion 5a5 protruding from the main body portion 5a1 to the second side Y2 in the first direction Y is formed, and the protruding portion 5a5 protrudes so as to overhang from the scanning line 3a and overlap with the second opening 41b in plan view. Further, the second opening 41b is formed so as to penetrate the interlayer insulating layer 42, the gate insulating layer 2, and the interlayer insulating layer 41. Therefore, the portion of the second capacitance electrode 5a is formed along the inner wall of the second opening 41b, and configures a light shielding wall.

In such a configuration, the gate electrode 8a and the second capacitance electrode 5a respectively configure the light shielding wall inside the first opening 41a and the second opening 41b, and thus, incidence of light on the semiconductor layer 1a is suppressed. Further, of the first opening 41a and the second opening 41b provided on both sides of the semiconductor layer 1a, only one of the first opening 41a and the second opening 41b overlaps with the scanning line 3a in plan view, and the other does not overlap with the scanning line 3a in plan view. Therefore, the width of the scanning line 3a can be made narrower. Further, of the first opening 41a and the second opening 41b provided on both sides of the semiconductor layer 1a, the gate electrode 8a is provided in the second opening 41b only, and the second capacitance electrode 5a to which the common potential is applied is provided in the first opening 41a. Therefore, even when the first opening 41a and the second opening 41b are brought closer to the semiconductor layer 1a, the gate electrode 8a and the semiconductor layer 1a are less likely to affect each other electrically. Thus, the interval between the first opening 41a and the second opening 41b can be narrowed. Therefore, the same effects as those of the first exemplary embodiment, such as being able to make the width of the scanning line 3a narrower, are obtained. Note that the configuration of the present exemplary embodiment may be applied to the second and third exemplary embodiments.

Other Embodiments

In the first, second, and third exemplary embodiments described above, the semiconductor layer 1a extends in the second direction X along the scanning line 3a, but the present disclosure may be applied to the electro-optical device 100 in which the semiconductor layer 1a extends in the first direction Y along the data line 6a, or to the electro-optical device 100 in which the semiconductor layer 1a is bent so as to extend along the data line 6a and the scanning line 3a.

Example of Installation in Electronic Apparatus

Figure 17:
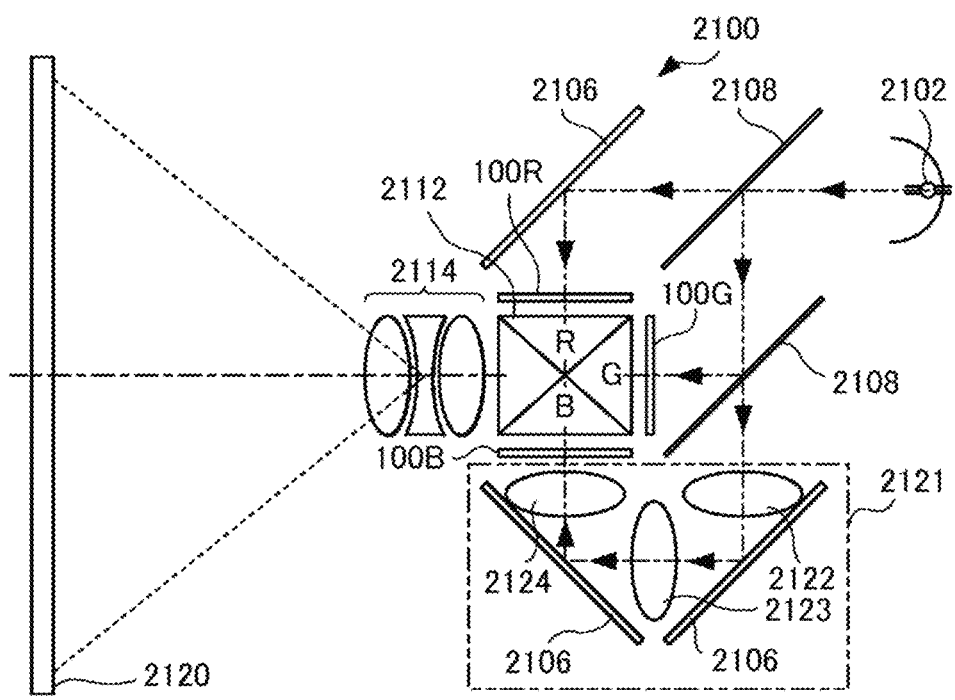
FIG. 17 is a schematic configuration view of a projection-type display apparatus using the electro-optical device to which the present disclosure is applied.

An electronic apparatus using the electro-optical device 100 according to the above-described exemplary embodiments will be described below. FIG. 17 is a schematic configuration view of a projection-type display apparatus using the electro-optical device 100 to which the present disclosure is applied. An illustration of optical elements, such as a polarizing plate, is omitted in FIG. 17. A projection-type display apparatus 2100 illustrated in FIG. 17 is an example of the electronic apparatus using the electro-optical device 100. The projection-type display device 2100, in which the electro-optical device 100 is used as a light valve, can perform high-definition and bright display without making the apparatus large. As illustrated in FIG. 17, a light source unit 2102 including a white light source, such as a halogen lamp, and the like is provided inside the projection-type display apparatus 2100. Projection light emitted from the light source unit 2102 is split into three primary colors of R (red), G (green), and B (blue) by three mirrors 2106 and two dichroic mirrors 2108 installed inside. The split incident light is guided to light valves 100R, 100G, and 100B corresponding to each of the primary colors, and then modulated. Note that since the light of the B color has a long optical path compared to the other light of the R color and the G color, the light of the B color is guided via a relay lens system 2121 including an incidence lens 2122, a relay lens 2123, and an emission lens 2124, to prevent loss due to the long optical path of the light of the B color.

The light modulated by each of the light valves 100R, 100G, and 100B is incident on a dichroic prism 2112 from three directions. Then, at the dichroic prism 2112, the light of the R color and the light of the B color are reflected at 90 degrees, and the light of the G color is transmitted. Therefore, after images of each of the primary colors are synthesized, a color image is projected onto a screen 2120 by a projection optical system 2114.

Other Projection-Type Display Apparatuses

Note that the projection-type display apparatus may include a configuration in which an LED light source or the like configured to emit light of each color is used as a light source unit and the light of each color emitted from the LED light source is supplied to another liquid-crystal device.

Other Electronic Apparatuses

The electronic apparatus including the electro-optical device 100 to which the present disclosure is applied is not limited to the projection-type display device 2100 of the above-described exemplary embodiment. Examples of the electronic apparatus may include a projection-type head up display, a direct-view-type head mounted display, a personal computer, a digital still camera, and a liquid crystal television.

What is claimed is:

1. An electro-optical device comprising:
   a scanning line extending in a first direction that is perpendicular to a thickness direction of the electro-optical device;
   a transistor including a semiconductor layer and a gate electrode having light shielding properties, the semiconductor layer being between the gate electrode and the scanning line in the thickness direction;
   an interlayer insulating layer provided in a layer between the transistor and the scanning line in the thickness direction and including a first opening and a second opening provided with the semiconductor layer interposed therebetween in plan view perpendicular to the thickness direction, the first opening being located on a first side of the semiconductor layer, the second opening being located on a second side, opposite to the first side, of the semiconductor layer; and
   a capacitance element in which at least one of capacitance electrodes has light shielding properties, wherein
   a portion of the gate electrode is provided along and inside an inner wall of the first opening on the first side of the semiconductor layer, the portion of the gate electrode extending into the interlayer insulating layer between the transistor and the scanning line in the thickness direction, and
   a portion of the at least one of the capacitance electrodes is provided along an inner wall of the second opening on the second side of the semiconductor layer, the portion of the at least one of the capacitance electrodes extending into the interlayer insulating layer between the transistor and the scanning line in the thickness direction.

2. The electro-optical device according to claim 1, comprising:
   a pixel electrode provided corresponding to the transistor, wherein
   the semiconductor layer includes a channel region overlapping with the gate electrode in plan view, a pixel electrode-side source drain region electrically connected to the pixel electrode, and a pixel electrode-side LDD region interposed between the channel region and the pixel electrode-side source drain region in plan view, and
   the first opening and the second opening are provided at least along the pixel electrode-side LDD region.

3. The electro-optical device according to claim 1, wherein
   the second opening is separated from the scanning line in plan view.

4. The electro-optical device according to claim 3, wherein
   the one of the capacitance electrodes includes a protruding portion protruding beyond the scanning line and overlapping with the second opening in plan view.

5. The electro-optical device according to claim 3, wherein
   the semiconductor layer extends along the scanning line.

6. The electro-optical device according to claim 5, wherein
   the semiconductor layer is provided at a position on the second opening side of a center, in a width direction, of the scanning line.

7. The electro-optical device according to claim 5, comprising:
   a data line extending in a direction intersecting the scanning line, wherein
   a width of the scanning line is narrower than a width of the data line.

8. The electro-optical device according to claim 1, wherein
   the gate electrode includes a conductive polysilicon layer and a light shielding layer having higher light shielding properties than the polysilicon layer, and
   the light shielding layer is provided along the inner wall of the first opening.

9. The electro-optical device according to claim 1, wherein
   the gate electrode is in contact, via the first opening, with a surface of the scanning line on a side of the semiconductor layer, and with a side surface of the scanning line.

10. The electro-optical device according to claim 1, wherein
    the second opening is provided up to a position on an opposite side of the scanning line from a side of the semiconductor layer.

11. An electronic apparatus comprising:
    the electro-optical device according to claim 1.

12. The electro-optical device according to claim 1, wherein the portion of the at least one of the capacitance electrodes includes a part provided at a position between the scanning line and the semiconductor layer in the thickness direction.

13. The electro-optical device according to claim 1, wherein the second opening is different from the first opening.

14. The electro-optical device according to claim 1, further comprising:
- a first data line electrically connected to the semiconductor layer of the transistor and extending along a second direction intersecting the first direction; and
- a second data line adjacent to the first data line, the second data line extending along the second direction, wherein
- the first opening is provided between the first data line and the second data line in plan view and is provided at a position overlapping with the scanning line in plan view, and
- the second opening is provided between the first data line and the second data line in plan view and is provided at a position not overlapping with the scanning line in plan view.

15. The electro-optical device according to claim 1, further comprising:
- a substrate main body, wherein
- the transistor provided on a side of the scanning line opposite from the substrate main body.

* * * * *